(12) United States Patent
Kwok et al.

(10) Patent No.: US 8,263,968 B2
(45) Date of Patent: Sep. 11, 2012

(54) DOUBLE SIDED EMISSION ORGANIC LIGHT EMITTING DIODE DISPLAY

(75) Inventors: Hoi-Sing Kwok, Kowloon (HK); Man Wong, Ma On Shan (HK); Jiaxin Sun, Kowloon (HK); Zhiguo Meng, Kowloon (HK); Xiuling Zhu, Kowloon (HK)

(73) Assignee: The Hong Kong University of Science and Technology, Hong Kong (CN)

( * ) Notice: Subject to any disclaimer, the term of this patent is extended or adjusted under 35 U.S.C. 154(b) by 1058 days.

(21) Appl. No.: 11/590,531

(22) Filed: Oct. 31, 2006

(65) Prior Publication Data
US 2007/0114522 A1     May 24, 2007

Related U.S. Application Data

(60) Provisional application No. 60/731,391, filed on Oct. 31, 2005.

(51) Int. Cl.
*H01L 51/52* (2006.01)
*H01L 27/32* (2006.01)

(52) U.S. Cl. ........... 257/40; 257/88; 257/E51.018; 257/E27.12; 257/E27.121; 313/500; 313/506

(58) Field of Classification Search .......... 257/40, 257/88, E51.018, E27.12, E27.121; 313/500, 313/504, 506; 315/169.3
See application file for complete search history.

(56) References Cited

U.S. PATENT DOCUMENTS

| | | | |
|---|---|---|---|
| 6,762,436 B1 | 7/2004 | Huang et al. | |
| 6,844,957 B2 | 1/2005 | Matsumoto et al. | |
| 6,882,383 B1 | 4/2005 | Su | |
| 6,909,233 B2 | 6/2005 | Cok et al. | |
| 7,053,560 B1* | 5/2006 | Ng | 315/185 R |
| 7,250,722 B2* | 7/2007 | Cok et al. | 313/506 |
| 7,557,512 B2* | 7/2009 | Kim et al. | 315/169.3 |
| 2003/0227254 A1* | 12/2003 | Terumoto | 313/504 |
| 2004/0061434 A1* | 4/2004 | Mori et al. | 313/500 |
| 2004/0075628 A1 | 4/2004 | Chien et al. | |
| 2006/0006792 A1* | 1/2006 | Strip | 313/500 |

* cited by examiner

*Primary Examiner* — Jerome Jackson, Jr.
*Assistant Examiner* — Yu Chen
(74) *Attorney, Agent, or Firm* — Leydig, Voit & Mayer, Ltd.

(57) ABSTRACT

An organic light-emitting diode display which can display independent images on both sides is described. This display can be driven with passive matrix or active matrix schemes. The invention combines a unique stacked organic diode structure and special driving schemes involving time-sequential reversed fields.

6 Claims, 12 Drawing Sheets n frame: $V_D > V_S$, Current from D to S.

n+1 frame: $V_D < V_S$, Current from S to D.

DOUBLE SIDED EMISSION ORGANIC LIGHT EMITTING DIODE DISPLAY

CROSS-REFERENCE TO RELATED APPLICATION

This application claims priority based upon U.S. Provisional Application Ser. No. 60/731,391, filed Oct. 31, 2005.

FIELD OF THE INVENTION

This invention relates an organic light-emitting diode (OLED) display, and more particularly to a double sided emission OLED display, where the images can be independently controlled.

BACKGROUND OF THE INVENTION

OLEDs are thinner, lighter, consume less power, and have faster response times than liquid crystal displays (LCD). Current designs of double-sided displays involve physically putting two displays back-to-back in an assembly. The present invention allows such double-sided displays to be made using a single display.

The double-side-emitting OLED can provide independent pictures on both sides at the same time, or it can provide images on either side. There are many situations requiring such double-sided displays in order to provide more information as well as saving space and being lighter. Examples of such applications are flip-style mobile phones, personal digital assistants, digital still cameras, and video recorders.

U.S. Pat. No. 6,762,436 B1 (Huang) presents a method for manufacturing a double-sided display structure for an organic light-emitting diode (OLED), involving plating an organic protection layer on the organic layer to protect various organic layers from being damaged by electron bombardment when the OLED element is subject to ITO sputtering during manufacture. The method involves plating an electron injecting layer and a thin metal film of a mating energy level on the organic protection layer; and plating a transparent conductive film on the electron injecting layer and the thin metal film to increase conductivity and protect the thin metal film from corrosion.

U.S. Published Patent Application No. 2004/0075628 A1 (Chien) provides a double-sided display device employing a transparent cathode that enables an OLED display device to illuminate concurrently. The device provides a conventional single side display OLED such that only one driving module is needed to output signals to display the same picture on the positive (anode) side and the negative (cathode) side concurrently.

U.S. Pat. No. 6,909,233 B2 (Cok) discusses an OLED device that includes a pixel having a plurality of individually addressable light emitting elements including a light emitting element for emitting white light, and one or more light emitting elements for emitting colored light; wherein at least one of the light emitting elements being stacked on top of another of the light emitting elements; and wherein the white light emitting elements are more efficient than at least one of the colored light emitting elements.

U.S. Pat. No. 6,882,383 B1 (Su) discusses a full-color organic light emitting diode (OLED) display which comprises a substrate, a white light emitting OLED, a first passivation layer, stacked layers of a color-converting layer and a color filter, and a second passivation layer. The white light emitting OLED comprises an anode, a cathode, and at least one white light emitting organic material layer disposed between the anode and the cathode. The first passivation layer covers the surface and sidewalls of the white light-emitting OLED. The stacked layers of the first passivation layer are separated at intervals. The second passivation layer covers the surface and sidewalls of the stacked layers.

U.S. Pat. No. 6,844,957 B2 (Matsumoto) describes a structure and fabrication technology for a reflective, ambient light, low cost display having a plurality of cells laid out side by side and stacked in as many as three levels on top of each other. Each stack of three cells is driven by an array of TFT's positioned on the bottom layer. Each cell comprises a light transmitting front window, three levels of individual cells RGB (Red, Green, and Blue) stacked on top of each other, each level having its own individual electrode, each electrode being connected by vertical conducting via holes running through each transparent dielectric spacer and being connected to an individual TFT. The bottom panel has a reflective surface so as to provide maximum reflectivity of the ambient light.

SUMMARY OF THE INVENTION

The disadvantages of prior devices can be overcome, and the advantages of the invention can be realized by providing in one embodiment of the invention a display constructed of one or a plurality of double-side-emission organic light emitting diodes comprising: a substrate; a stack of two organic light emitting diodes in tandem; each organic light emitting diode having an anode, a cathode and a number of organic layers between the anode and the cathode; the anode of the first organic light emitting diode being in contact with the substrate, and the cathode of the first organic light emitting diode being in contact with the anode of the second organic light emitting diode; the anode of the first organic light emitting diode and the cathode of the second organic light emitting diode being transparent or semitransparent; the cathode of the first organic light emitting diode and the anode of the second organic light emitting diode being opaque to light; the anode of the first organic light emitting diode and the cathode of the second organic light emitting diode being connected to each other and are connected to the driving circuit by an electrode; and the cathode of the first organic light emitting diode and the anode of the second organic light emitting diode being in contact with each other and are connected to the driving circuit.

In another embodiment the invention provides a display constructed of one or a plurality of double-side-emission organic light emitting diodes comprising: a substrate; a stack of two organic light emitting diodes in tandem; each organic light emitting diode having an anode, a cathode and a number of organic layers between the anode and the cathode; the anode of the first organic light emitting diode being in contact with the substrate, and the cathode of the first organic light emitting diode being in contact with the anode of the second organic light emitting diode; the anode of the first organic light emitting diode and the cathode of the second organic light emitting diode being transparent or semitransparent; the cathode of the first organic light emitting diode and the anode of the second organic light emitting diode being opaque to light; the anode of the first organic light emitting diode and the cathode of the second organic light emitting diode being connected to each other and are connected to the driving circuit by an electrode; and the cathode of the first organic light emitting diode and the anode of the second organic light emitting diode being in contact with each other and are connected to the driving circuit.

BRIEF DESCRIPTION OF THE DRAWINGS

Further features and advantages of the present invention will become apparent upon review of the following detailed description of the preferred embodiments with reference to the accompanying drawings, in which.

DETAILED DESCRIPTION OF THE PREFERRED EMBODIMENTS

Figure 1:
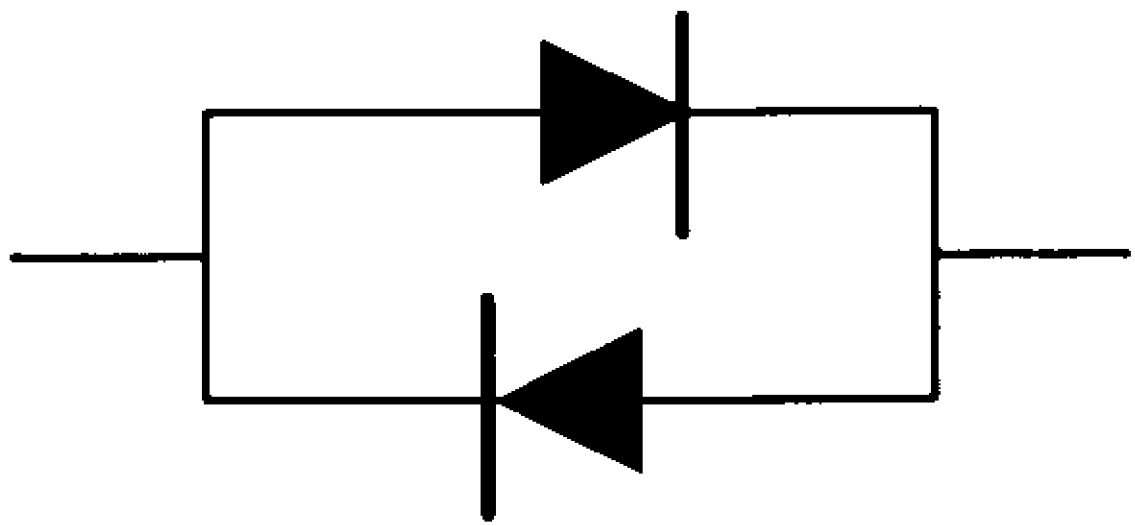
FIG. 1 is a diagram showing implementation of the parallel diodes using a stacked structure of one embodiment of the invention.

The present invention allows an organic light-emitting diode to emit light from both sides with independent driving voltages. This is possible with the combination of two innovations: (1) the OLED architecture is such that there are two OLEDs arranged with their anodes and cathodes connected as shown in FIG. 1. We shall call this the parallel stacked OLED (PS-OLED), and (2) the driving scheme is such that the electronic signals from two different images are interlaced in time together to driving the matrix display, with the two signals being opposite in sign. Thus, positive signals will drive one OLED and negative signals will drive the other OLED.

Figure 2:
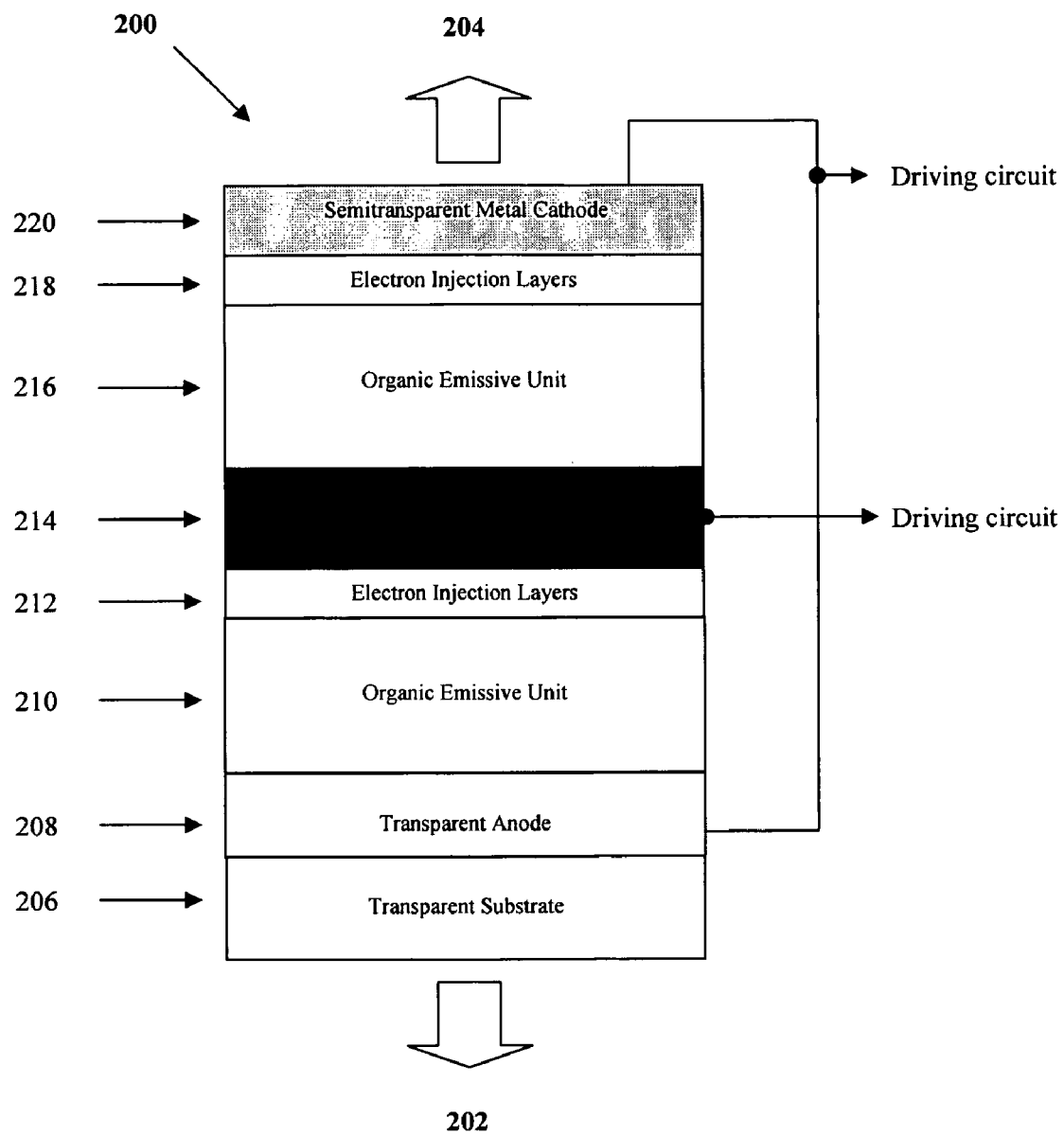
FIG. 2 is a schematic diagram of the parallel diodes for each pixel in the double-side emission OLED of the present invention.

In order to implement the PS-OLED, we fabricated a stacked OLED where the middle electrode can function as an anode for one OLED, as well as a cathode for the other OLED. Also, the middle electrode has to be connected to the driving circuit and the outer most anode and cathode have to be connected together and connected to the driving circuit as shown in FIG. 2. The middle electrode of the stacked OLED has to be opaque as well. In one embodiment of the present invention, we employ opaque Ag or Au layer (with thickness over 70 nm) as the middle black reflective electrode and treat the surface of silver or gold with a $CF_4$-Plasma to enhance the hole carrier injection from it when acting as the anode of top emission OLED to fabricate a double-sided emission OLED.

The middle black reflective electrode which is Ag or Au (with thickness over 70 nm) can function well as the cathode of bottom emission OLED when combined with efficient electron injection layer, e.g., LiF(1 nm)/Al(3 nm) and at the same time well as the anode of top emission OLED due to the $CF_4$-Plasma treatment on it. Although the bottom and top emission OLED share the common electrode Ag or Au, the electroluminescent performance of them can be independently controlled and optimized.

This invention teaches how to drive this stacked OLED as a pixel in double-sided emission active matrix OLED display using passive matrix as well as active matrix. For passive matrix driving, the scanning signal and the data signal have to have a positive as well as a negative field, corresponding to the timing of the two OLEDs.

Figure 7:
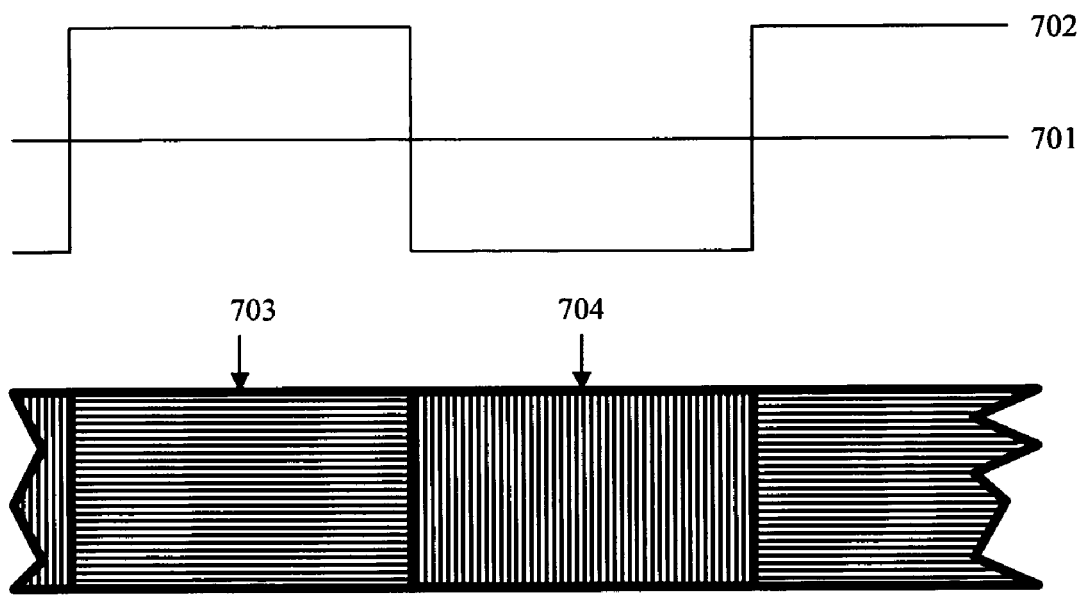
FIG. 7 provides schematics of (a) relative values of common supply voltage and middle electrode voltage, and (b) the resulting display mode.

For active matrix driving, a-Si TFT or p-Si TFT can be used as pixel driving elements. The a-Si TFT or p-Si TFT used to drive this OLED pixel has alternative positive and negative biasing on its source and drain, i.e., one duration for $V_d < V_s$ and another duration for $V_s < V_d$ depending on either front or rear panel is selected to display images. This is schematically shown in FIG. 7. This alternative biasing on source and drain of the a-Si TFT or p-Si TFT actually has another benefit in prolonging the lifetime of the TFT. It has been proven to be helpful for enhancing stability of driving TFT during operation.

FIG. 2 shows an exemplary embodiment of a stacked OLED (SOLED) 200 as a pixel in PM/AM OLED display utilizing the present invention. The SOLED structure 200 of FIG. 2 includes two OLEDs, one is bottom emission OLED 202, the other is top emission OLED 204. The SOLED structure 200 is fabricated on a substrate 206, which is composed of a substantially transparent material such as glass in this embodiment. Above substrate 206 is the bottom electrode layer 208, which is ITO in this case acting as the anode of bottom emission OLED 2002. The bottom emission OLED 202 comprises organic emissive unit 210, which normally includes the hole transporting layer (HTL), the emission layer (EML) and electron transporting layer (ETL) in sequence. A further electron injection layer 212 is deposited on top of organic emissive unit 210. An opaque metal layer 214, silver or gold, is deposited on the electron injection layer 212 to act as the cathode of bottom emission OLED 202.

After deposition of opaque metal layer 214, silver or gold, the partially fabricated device was transferred to $CF_4$-plasma treatment chamber for 10 seconds under the constant pressure of 20 Pascal. After that, the treated device was returned to the deposition vacuum chamber for fabricating the top emission OLED 204. The top emission OLED 204 uses silver or gold 214 (treated by $CF_4$-plasma) as the anode and includes of another organic emissive unit 216 and EIL 218 deposited sequentially on top of it. Finally, a semitransparent metal layer 220 was formed, which functions as the cathode of top emission OLED 204. The opaque silver or gold function as the cathode of 214, as well as anode of 204 and is the middle electrode of the total SOLED. The semitransparent metal layer 220 is the top electrode of the total SOLED and will be in direct connection with sputtering ITO when fabricating the AM/PM OLED display.

When applying appropriate voltage across the bottom and top emission OLED through the external driving circuit, the front side and rear side light emission can be achieved selectively.

Figure 3A:
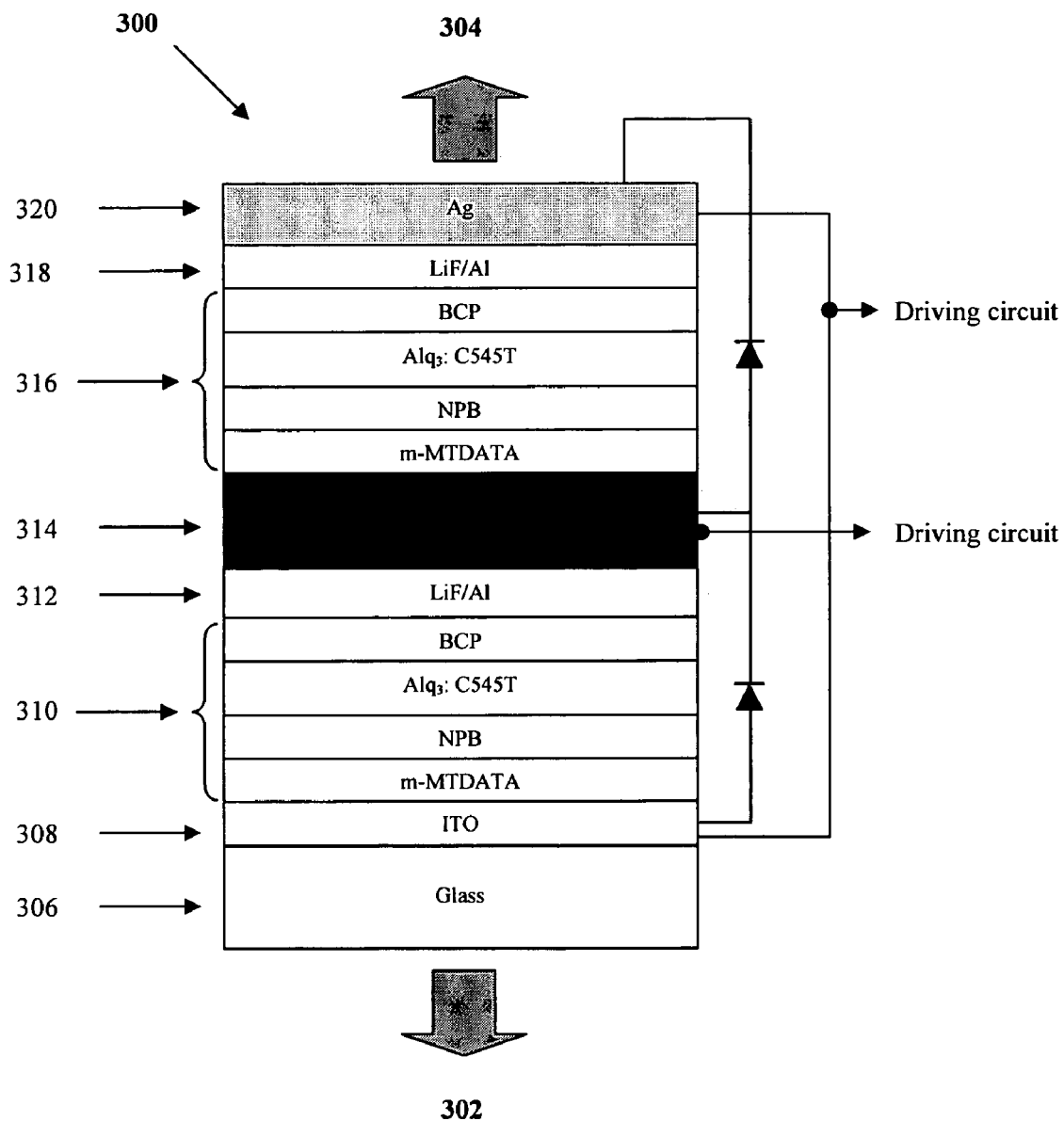
FIG. 3A shows the embodiment of FIG. 2 having parallel diodes using stacked structure with both sides emitting green light.

FIG. 3A shows a schematic cross-section of a SOLED with green bottom and green top light emission 300, wherein the detailed materials used are also included. All functional layers marked are matching with corresponding ones in 200. The materials used to form the layers will be abbreviated as follows:

ITO: indium-tin-oxide;

$CF_4$: carbon tetrafluoride; used for working gas in the plasma treatment chamber with 20 Pa;

m-MTDATA:4,4',4''-tris(N-3-methylphenyl-N-phenyl-amino)-triphenylamine;

NPB: 4,4'-N,N'-di(naphthalene-1-yl)-N,N'-diphenyl-benzidine;

$Alq_3$: tris(8-hydroxyquinoline)aluminium(III);

C545T: 10-(2-benzothiazolyl)-1,1,7,7-tetramethyl-2,3,6,7-tetrahydro-1H,5H, 11H-benzo[1]pyrano[6,7,8-ij]quinolizin-11-one;

BCP: 2,9-Dimethyl-4,7-diphenyl-1,10-phenanthroline;

LiF/Al: lithium fluoride/aluminum; used for electron injection layer; and

Ag or Au: silver or gold; used for opaque reflective electrode or semitransparent top cathode.

Figure 3B:
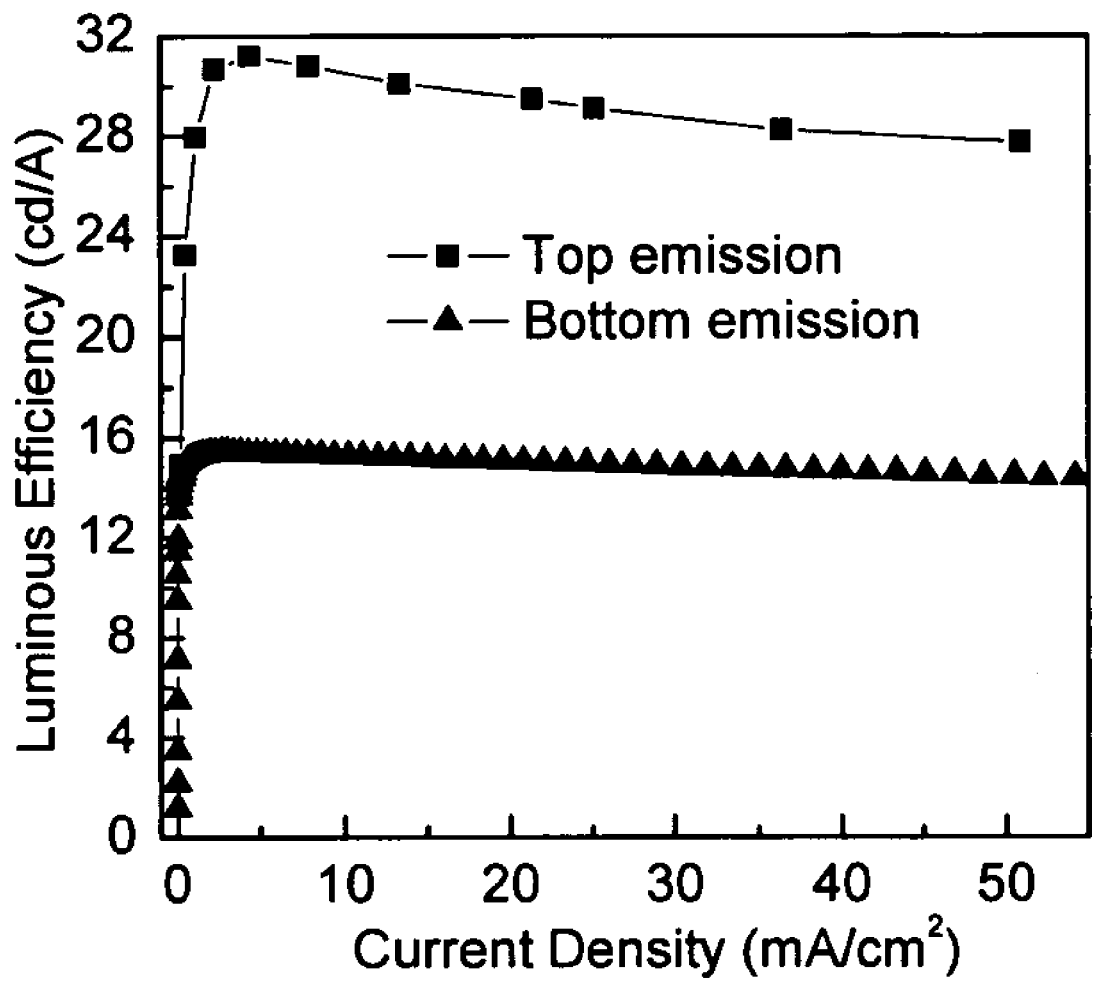
FIG. 3B shows experimental efficiency results from the SOLED shown in FIG. 3A.
Figure 3C:
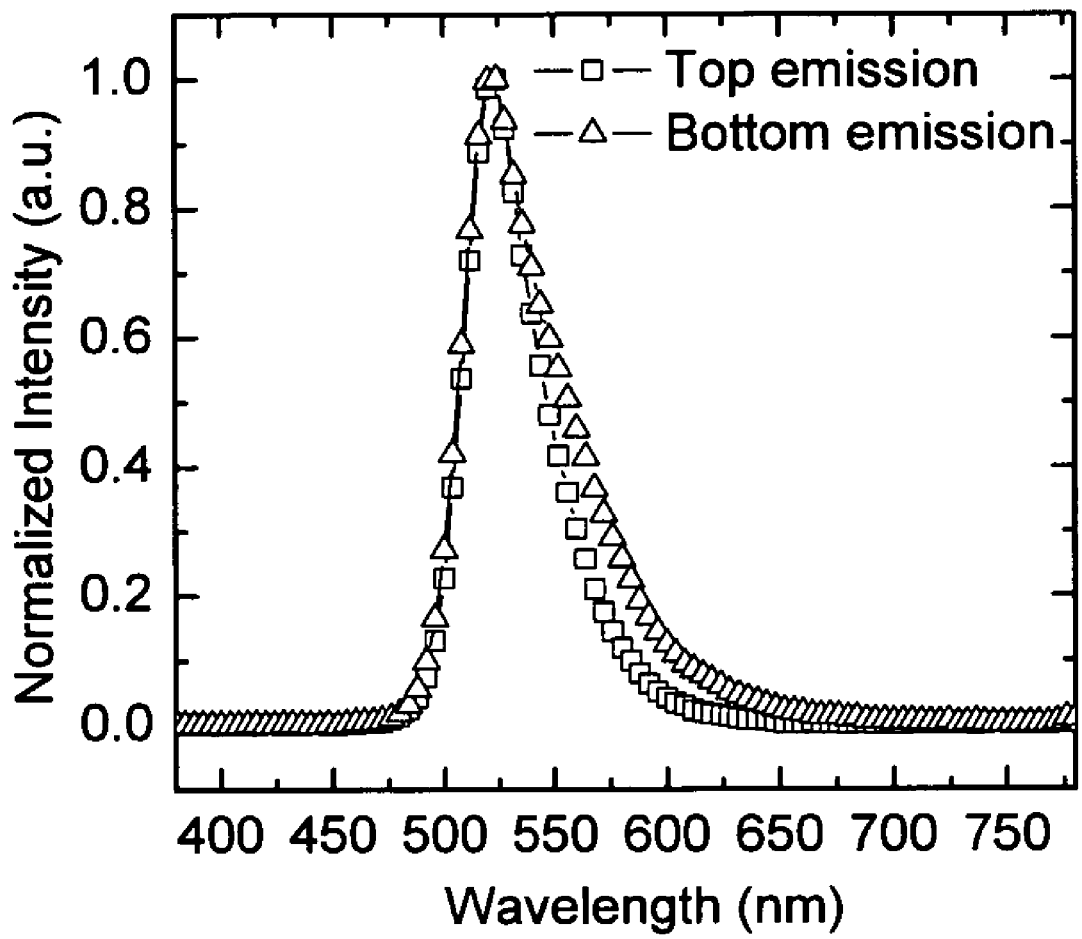
FIG. 3C shows experimental results on emission spectra from the SOLED shown in FIG. 3A.

FIG. 3B shows the experimental emission efficiency results obtained using this SOLED. FIG. 3C shows the emission spectra from the top and bottom OLEDs. These results demonstrate that the double side organic light emitting diode works. What is then needed will simply be the driving scheme necessary for driving an array of such SOLED.

Figure 4:
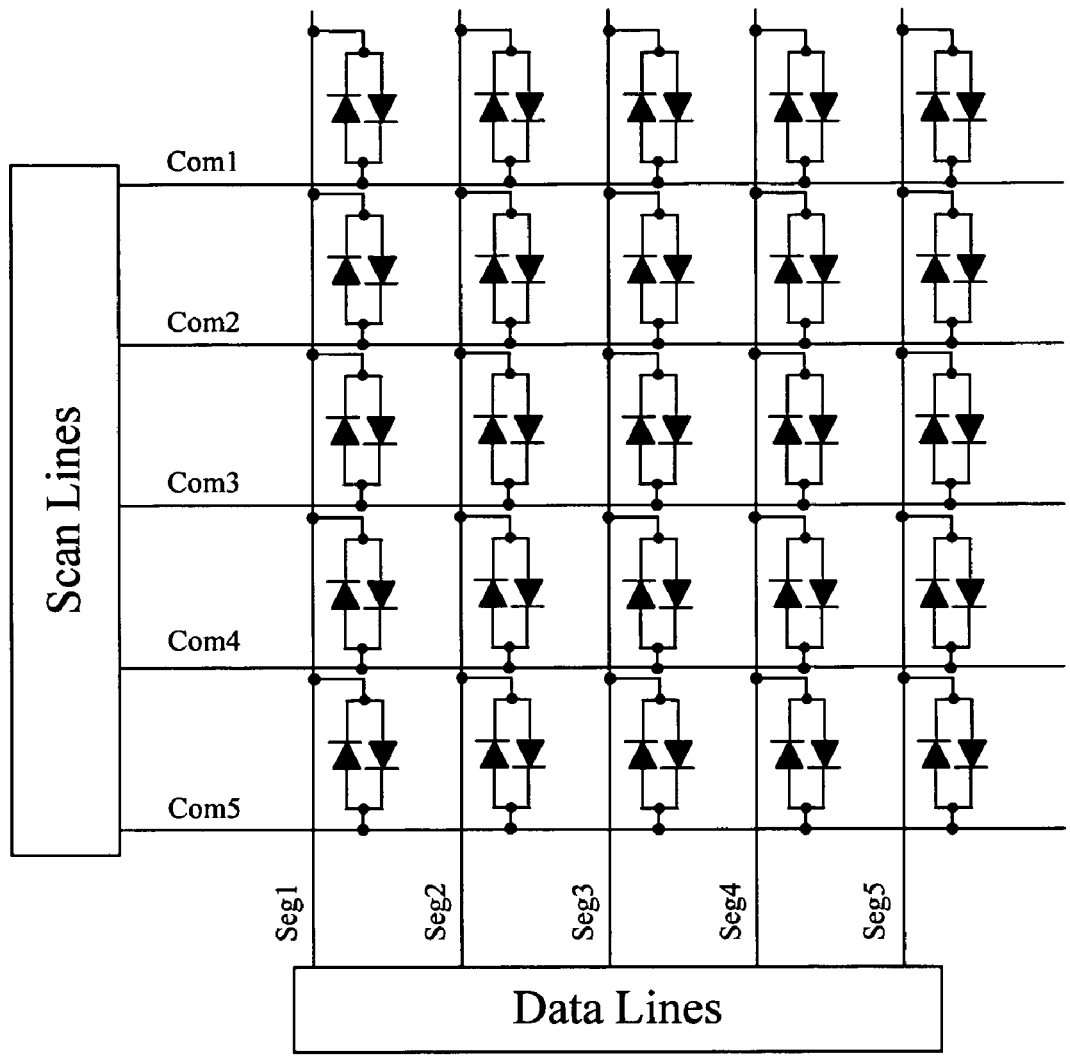
FIG. 4 is an internal circuit diagram of a passive matrix driven display using double side emission OLED's as pixels.

FIG. 4 shows the internal circuit diagram of PM OLED display. Such display comprises a plurality of scan lines Com1, Com2, Com3, Com4, Com5; a plurality of data lines Seg1, Seg2, Seg3, Seg4, Seg5; and a pixel array; wherein each pixel is a stacked OLED in which the top emission OLED and bottom emission OLED are connected as shown in FIG. 1. Within one pixel, the middle electrode of SOLED has to be connected to one scan line and the outer most anode and cathode have to be connected together and connected to the corresponding data line. Positive and negative voltages interlaced together may be used to drive this PM OLED display. Selection and de-selection of a particular scan line is respectively achieved by putting a definite voltage on or putting in a high impedance state the port of the scan circuit to which the line is connected. More importantly, the present invention can be well combined with a-Si or p-Si TFT to form AM OLED display with improved stability.

Figure 5:
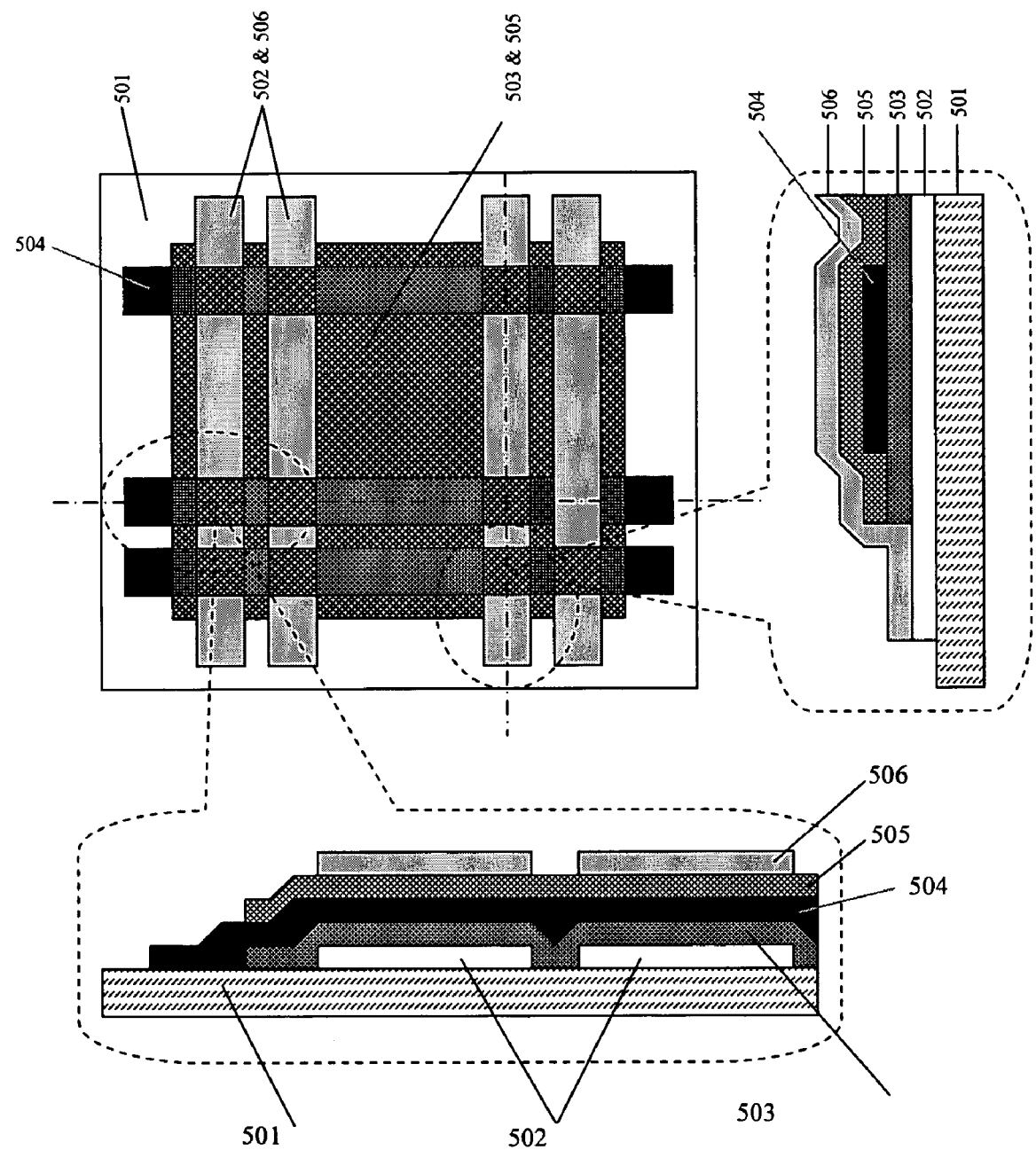
FIG. 5 is a plane view and cross-sectional view of the double-side-emission passive matrix OLED display.

FIG. 5 shows a plane view and cross-sectional view of an example of a double sided emission passive matrix driven OLED display. On the transparent substrate 501, the ITO layers 502 are patterned to form rows of anodes in the first direction. The organic layers 503 of the bottom emitting OLED are coated next. The middle metal layers 504 are then deposited through a shadow mask to form columns of anode-cathodes electrodes. These middle electrode lines 504 are perpendicular to the anode 501. The organic layers 505 of the top emitting OLED are then deposited on this middle electrode 504. It is then followed by the semitransparent metals cathodes 506 in the same direction as the anode 501 through the same shadow mask. The problems of electrical shorting can be avoided with carefully designed layer dimension as well as shadow mask when fabricating.

Figure 6:
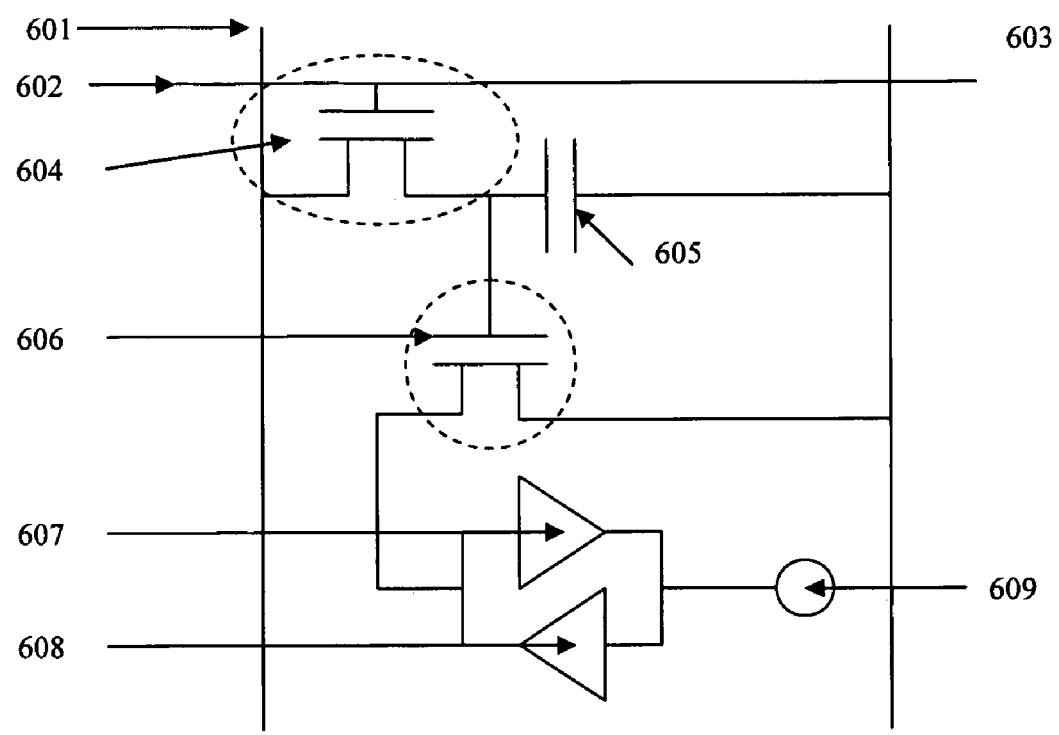
FIG. 6 is a circuit schematic of one stacked OLED pixel in an active matrix driving scheme.

FIG. 6 shows the circuit diagram of one SOLED pixel in the AM OLED display. This circuit comprises one data line 601; one scan line 602; common power supply line 603 (for driving TFT); one addressing TFT 604; one capacitor 605 for voltage signal storage; one driving TFT 606; bottom emission OLED 607 and top emission OLED 608, wherein the anode-cathode layer (opaque silver or gold) is shared as the common electrode 609. The anode 607 (ITO) and Cathode 608 (semi-transparent metal) are also connected together. Source or drain of addressing TFT 604 is connected with 601, drain or source of 604 is connected with one port 605, and gate 604 is connected with scanline 602.

Assuming that all TFTs are N-type (a-Si or p-Si), when the voltage of scanline 602 was high, drain or source 604 was switched on, voltage signal on the data line 601 was written in 605. When the voltage of scanline 602 was back to low, the voltage signal was stored in capacitor 605. One port of capacitor 605 is connected with common power supply line 603; the other is connected with gate 606. The voltage signal stored in capacitor 605 will decide whether driving TFT 606 are switched on or off. The anode of 607 and the cathode of 608 are connected with the source/drain 606. The voltage difference between common electrode 609 and common power supply line 603 will decide the working status of OLED 607 and 608.

FIG. 7 shows the specific working status of the AM OLED display including the present invention. For this double sided emission display, the front and rear side emission can be the same or different. The direct voltage 701 supplied to 603, common power supply line which we assume is five volts here. The square voltage pulse 702 supplied to common electrode 609, in which for the sake of discussion, low voltage is zero volts and high voltage is ten volts. If displaying images are standard video images, the frame period is 16 ms, and duration of low and high voltage is set equally to be 8 ms. When square voltage pulse electrode 702 is high, it will generate positive bias voltage on top emission OLED 608 and reversed for bottom emission OLED 607. Therefore, in this 8 ms time duration, images 703 will display on the top side. When the square voltage pulse 702 is low, it will generate positive bias voltage on OLED 607 while reversed for cathode 608, images 704 will display on bottom side. In the course of displaying images, the relative voltage polarity between direct voltage 701 and square voltage pulse 702 are alternatively positive and negative. Images on both sides can be the same or different, or one of them is non-selected to be dark. These features are fully satisfied with the requirements of folding-type mobile phone.

Figure 8:
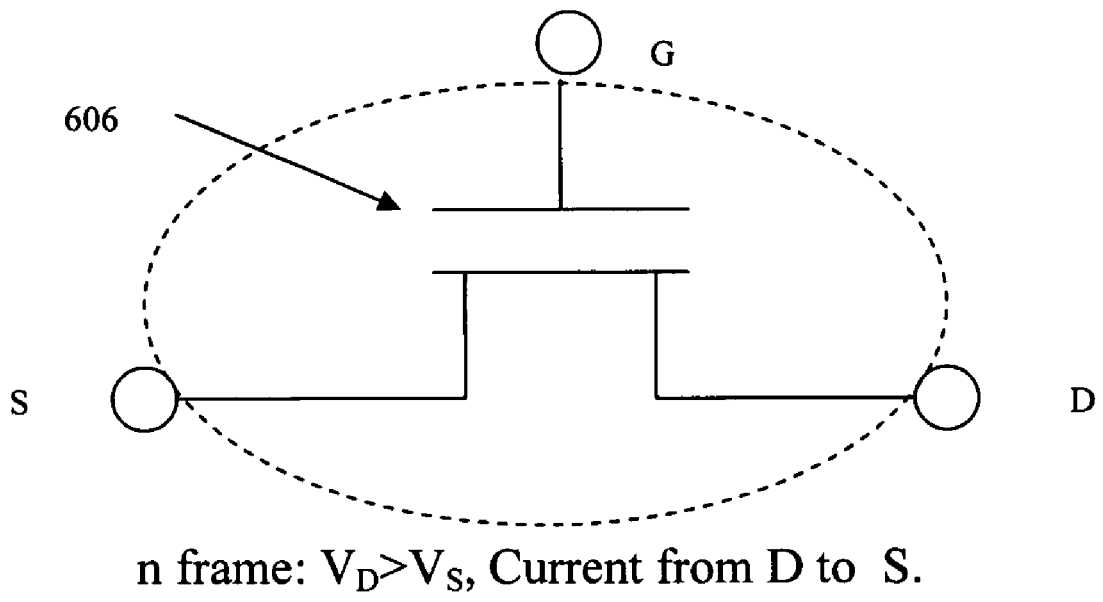
FIG. 8 illustrates the driving TFT in a double sided emission AM OLED display.

FIG. 8 shows the specific status of the driving TFT 606. We define, in 606, the port connecting with common power supply line 603 as the drain, denoted as D, the port connecting with bottom emission OLED 607 and top emission OLED 608 as the source, denoted as S. In the Nth frame period, common electrode 609 is low for the first half of the frame; electrical potential of D ($V_D$) is larger than that of S ($V_S$) and current flows from D to S. Common electrode 609 is high for the second half of the frame; $V_D$ is smaller than $V_S$ and current flows from S to D.

Figure 9:
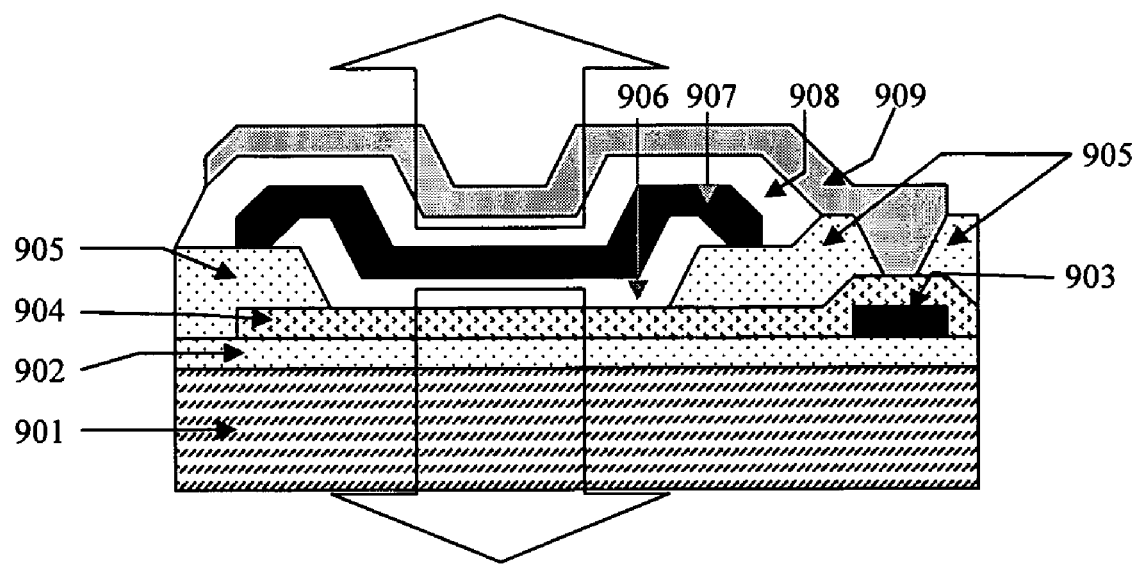
FIG. 9 is a cross-sectional view of a pixel in double sided emission AM OLED display.

FIG. 9 shows cross-section view of a pixel in present double sided AM OLED display. This fabrication process comprises depositing a buffer layer of LTO/SiNx sequentially 902 on a glass substrate 901; then depositing ITO electrode 904 covering the drain electrode 903 of driving TFT; then depositing LTO insulator layer 905 to avoid edge short; then depositing organic emissive units 906 of bottom emission OLED; then depositing middle metal (silver or gold) 907 acting as both the cathode of bottom emission OLED and anode of top emission OLED; then depositing organic emissive units 908 of top emission OLED and then semitransparent metal cathode 909 of top emission OLED connecting to 904 via holes. The size of organic and metal layers can be precisely controlled by micro region masking technology.

Figure 10:
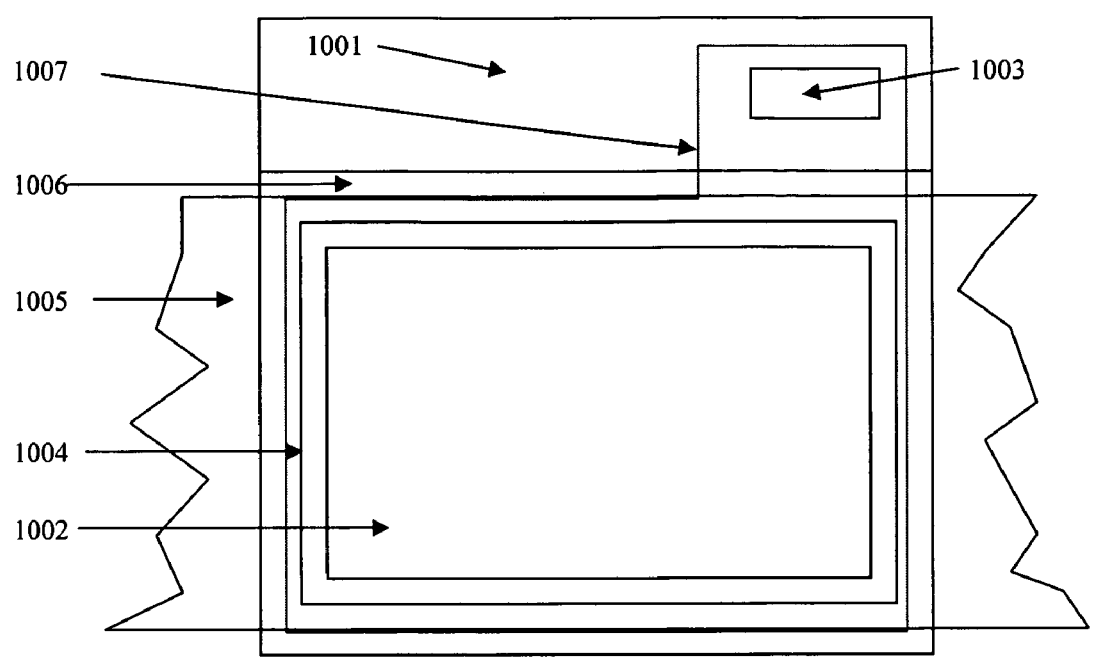
FIG. 10 is a plane view of fabrication process of a pixel in double sided emission AM OLED display.

FIG. 10 shows the plane view of a pixel structure in present double-side-emission AM OLED display. This structure comprises driving matrix 1001 consisting of addressing TFT, driving TFT and storage capacitor and corresponding metal electrode; bottom electrode 1002 acting as the anode of bottom emission OLED; ITO electrode 1003 connecting to top semitransparent metal cathode of top emission OLED; organic emissive units 1004 of bottom emission OLED; middle electrode (silver or gold) 1005 acting as both the cathode of bottom emission OLED and anode of top emission OLED; organic emissive units 1006 of top emission OLED and semitransparent metal cathode 1007 of top emission OLED connecting to 1003.

The present invention can be applicable to small size display market such as personal digital assistant (PDA), digital still camera (DSC) and especially the folding-type cell phone due to its capable of displaying two independent images one each side.

While the invention has been described in connection with preferred embodiments, it should be apparent to those of ordinary skill in the art that various alterations and modifications can be made without departing from the spirit and scope of the invention. It is therefore intended that the invention be defined by the following claims.

What is claimed is:

1. A double-sided organic light emitting diode (OLED) architecture for emitting light from both sides using independent driving voltages, the architecture comprising:
    an opaque middle electrode, configured to act as an anode for a first OLED and a cathode for a second OLED;
    a semitransparent cathode corresponding to the first OLED;
    a transparent anode corresponding to the second OLED; and
    a driving circuit, comprising a driving thin-film transistor (TFT) for driving both the first OLED and the second OLED, wherein a source or drain of the driving TFT is connected to both the semitransparent cathode corresponding to the first OLED, and the transparent anode corresponding to the second OLED;
    wherein the driving circuit is configured to provide signals to the first OLED and the second OLED corresponding to independent images that are opposite in sign and interlaced in time, and wherein signals of one sign drive the first OLED and signals of the other sign drive the second OLED.

2. The architecture of claim 1, wherein the opaque middle electrode is an opaque Ag or Au layer with a thickness of over 70 nm.

3. The architecture of claim 1, wherein a surface of the opaque middle electrode corresponding to the first OLED is treated with CF4-Plasma so as to enhance hole carrier injection.

4. The architecture of claim 1, wherein the opaque middle electrode is reflective.

5. The architecture of claim 1, wherein the transparent anode is indium tin oxide or indium zinc oxide.

6. The architecture of claim 1, wherein the driving circuit further comprises:
    a common power line;
    an addressing TFT;
    a capacitor connected to the addressing TFT and a gate of the driving TFT;
    a data line connected to a source or drain of the addressing TFT; and
    a scanning line connected to a gate of the addressing TFT.

* * * * *